(12) United States Patent
Yokoyama et al.

(10) Patent No.: US 8,988,124 B2
(45) Date of Patent: Mar. 24, 2015

(54) SEMICONDUCTOR INTEGRATED CIRCUIT

(75) Inventors: Masanao Yokoyama, Kanagawa (JP);
Noboru Okuzono, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 209 days.

(21) Appl. No.: 13/292,133

(22) Filed: Nov. 9, 2011

(65) Prior Publication Data
US 2012/0133407 A1 May 31, 2012

(30) Foreign Application Priority Data

Nov. 26, 2010 (JP) ................................ 2010-264097

(51) Int. Cl.
*H03K 3/289* (2006.01)
*H03K 3/356* (2006.01)
*H03K 3/012* (2006.01)
*H03K 3/3562* (2006.01)

(52) U.S. Cl.
CPC .......... *H03K 3/012* (2013.01); *H03K 3/356156* (2013.01); *H03K 3/35625* (2013.01)
USPC .......................................... 327/203; 327/202

(58) Field of Classification Search
USPC .......... 327/218, 201–203, 206, 208, 212, 214
See application file for complete search history.

(56) References Cited

U.S. PATENT DOCUMENTS

| 6,429,713 | B2 | 8/2002 | Nakaizumi | |
| 6,614,276 | B2 * | 9/2003 | Robertson et al. | 327/211 |
| 7,053,424 | B2 * | 5/2006 | Ono | 257/208 |
| 7,248,090 | B2 * | 7/2007 | Ramprasad | 327/202 |
| 7,616,041 | B2 * | 11/2009 | Frederick et al. | 327/202 |

FOREIGN PATENT DOCUMENTS

JP 2001-237675 8/2001

* cited by examiner

*Primary Examiner* — Hai L Nguyen
(74) *Attorney, Agent, or Firm* — Young & Thompson

(57) ABSTRACT

An input buffer chooses, in accordance with first control clocks, to output an input data signal or output a high-impedance signal. A master flip-flop chooses, in accordance with second control clocks, to output a data signal received from the input buffer or retain a currently output data signal. A master-slave switch chooses, in accordance with the second control clocks, to output a high-impedance signal or output a data signal received from the master flip-flop. A slave flip-flop chooses, in accordance with the second control clocks, to retain a currently output data signal or output a data signal received from the master-slave switch. A clock buffer inputs the second control clocks, and generates and outputs the first control clocks.

5 Claims, 7 Drawing Sheets

SEMICONDUCTOR INTEGRATED CIRCUIT

CROSS-REFERENCE TO RELATED APPLICATIONS

The disclosure of Japanese Patent Application No. 2010-264097 filed on Nov. 26, 2010 including the specification, drawings, and abstract is incorporated herein by reference in its entirety.

BACKGROUND

The present invention relates to a semiconductor integrated circuit, and more particularly to a master-slave flip-flop circuit.

In recent years, an LCD driver capable of operating at a high speed is demanded as liquid-crystal panel displays exhibit improved motion picture response. The speed of the LCD driver can be increased, for instance, by shortening the propagation delay time tpd of a flip-flop circuit (hereinafter referred to as the FF circuit) used in the LCD driver. It is also demanded that the FF circuit of a video signal input stage operate at an increased speed as an input video signal for the LCD driver is serialized. Consequently, it is demanded that the propagation delay time tpd be shortened while setup time and hold time, which determine the skew between an input signal and a clock signal, can be optimally adjusted.

Particularly when the employed transmission method is such that a clock signal is embedded in a serial data signal, the active edge of a clock generated by a clock recovery circuit coincides in time with a data signal change point. It is therefore important that mainly the setup time be secured. The reason is that if an attempt is made to secure a long setup time by adjusting the phase of the clock recovery circuit, the hold time, which is difficult to control, cannot be sufficiently secured due to the active edge of the next clock.

A technology for increasing the operating speed of the FF circuit is described, for instance, in Japanese Unexamined Patent Publication No. 2001-237675. A D-FF circuit described in Japanese Unexamined Patent Publication No. 2001-237675 is a master-slave D-FF circuit. This circuit can retard the operation stop clock of a master FF and advance the operation start clock of a slave FF to shorten the setup time while maintaining the propagation delay time tpd.

FIG. 1 is a diagram illustrating the configuration of the D-FF circuit described in Japanese Unexamined Patent Publication No. 2001-237675. Referring to FIG. 1, the D-FF circuit described in Japanese Unexamined Patent Publication No. 2001-237675 includes a master FF 100, an input control switch G1 for controlling the input of data DATA into the master FF 100, an input control switch G3 for controlling the input of data output from the master FF 100 into a slave FF 200, and a slave FF 200. The master FF 100 includes a feedback control switch G2 for latching input data DATA. The slave FF 200 includes a feedback control switch G4 for latching input data.

The input control switch G1 and the feedback control switch G2 operate in synchronism with control clocks CLK2, /CLK2. The input control switch G3 and the feedback control switch G4 operate in synchronism with control clocks CLK, /CLK1. A clock generator circuit 300 shown in FIG. 2 generates the control clocks CLK, /CLK1, CLK2, /CLK2 from a clock CLK.

Referring to FIG. 2, the clock generator circuit 300 (switch control circuit) includes an inverter 301, a buffer 302, and an inverter 303, which are cascade-coupled and arranged in the order named from the input side. The clock CLK is output as the clock /CLK1 through the inverter 301. The clock /CLK1 is output as the clock /CLK2 through the buffer 302. The clock /CLK2 is output as the clock CLK2 through the inverter 303. In other words, the clocks CLK2, /CLK2 are generated by retarding the clocks CLK, /CLK1.

The input control switch G1 for transmitting an input signal to the master FF 100 and the feedback control switch G2 for the master FF 100 start operating and stop in synchronism with the clocks CLK2, /CLK2 whose timings are retarded from the timing of the input control switch G3, which transmits an input signal to the slave FF 200. Therefore, the timing at which data (internal data) is loaded from the master FF 100 into the slave FF 200 is retarded. Consequently, the setup time is shorter than for the D-FF circuit, which controls the master FF and slave FF with the clock CLK alone. Meanwhile, the propagation delay time tpd is determined in accordance with the through operation start time of the slave FF 200, which operates in accordance with the clock CLK. Therefore, the setup time is shortened without changing the propagation delay time tpd. Hence, the D-FF circuit described in Japanese Unexamined Patent Publication No. 2001-237675 can shorten the setup time while maintaining the propagation delay time tpd.

SUMMARY

To improve the setup time while shortening the propagation delay time tpd, it is necessary to advance the change point for the data DATA relative to the active edge of the clock CLK, which controls the input control switch for transmitting an input signal to the master FF, or retard the active edge of the clock CLK, which controls the input control switch, relative to the change point for the data DATA.

For example, the data DATA can be advanced relative to the clock CLK, which controls the input control switch, by increasing the gate width (W) of a transistor that forms the input control switch. However, if the gate size of the transistor is increased, the output load capacitance of the switch control circuit (clock buffer), which drives the input control switch, is increased to dull the signal waveform of the clock CLK. Further, if the size (driving force) of the clock buffer is increased to prevent the signal waveform from being dulled, the clock CLK is advanced relative to the data DATA so that the setup time cannot be adjusted.

If, on the other hand, the driving force of the clock buffer is decreased to retard the clock relative to the data, the propagation delay time tpd of the whole FF circuit is increased.

As described above, it is difficult to make such adjustments as to shorten the propagation delay time tpd in the FF circuit while improving the setup time.

The D-FF circuit described in Japanese Unexamined Patent Publication No. 2001-237675 can improve the setup time while maintaining the propagation delay time tpd. However, if it attempts to shorten the propagation delay time by increasing the speed of data transfer and adjust the setup time for speed enhancement, the following problem occurs:

If the gate size of a transistor for the input control switch G1 is increased, the load capacitance coupled to the output of the clock buffer (inverter 303 and buffer 302), which controls the input control switch G1, is increased to dull the signal waveforms of the clocks CLK2, /CLK2. To prevent the signal waveforms from being dulled, it is necessary to increase the driving capacity of the inverter 303 and the buffer 302. However, the load capacitance coupled to the inverter 303 and buffer 302 corresponds to the sum of the input control switch G1 and feedback control switch G2. Therefore, the sizes of the inverter 303 and buffer 302 need to be adjusted to match the total load capacitance. In other words, if the technology described in Japanese Unexamined Patent Publication No. 2001-237675 is used to shorten the rise time and fall time of the clocks CLK2, /CLK2 for the purpose of data speed enhancement, the size of a transistor for the inverter 303 and buffer 302 needs to be unduly increased. This will increase the layout size of the D-FF circuit.

Further, in recent years, an FF circuit capable of transferring data at a speed higher than a process-specific operating speed is demanded due to an increase in the speed of LCD drivers and a trend toward serial transmission of input video signals and lower power consumption. When the timings of the clocks CLK2, /CLK2 are to be adjusted with the D-FF circuit described in Japanese Unexamined Patent Publication No. 2001-237675, it is necessary to consider the total load capacitance of the input control switch G1 and feedback control switch G2. Consequently, it is difficult for the related art technology to make timing adjustments in accordance with high-speed data. Hence, a D-FF circuit capable of making timing adjustments with increased efficiency is now demanded.

In order to address the above-mentioned problem, the present invention employs the following means. In order to clarify the correspondence between "WHAT IS CLAIMED IS" and "DETAILED DESCRIPTION," technical matters concerning the means are expressed with the aid of numerals and symbols, which are used under "DETAILED DESCRIPTION." However, the numerals and symbols should not be used to restrictively interpret the technical scope of the present invention, which is defined under "WHAT IS CLAIMED IS."

A semiconductor integrated circuit according to an aspect of the present invention includes a D-FF circuit and clock buffers (103, 104). The D-FF circuit includes an input buffer (1), a master flip-flop (2), a master-slave switch (3), and a slave flip-flop (4). In accordance with first control clocks (N3, N4), the input buffer (1) chooses to output an input data signal (DATA) or output a high-impedance (Hi-Z) signal. In accordance with second control clocks (N1, N2), the master flip-flop (2) chooses to output a data signal received from the input buffer (1) or retain a currently output data signal. In accordance with the second control clocks (N1, N2), the master-slave switch (3) chooses to output a high-impedance (Hi-Z) signal or output a data signal output from the master flip-flop (2). In accordance with the second control clocks (N1, N2), the slave flip-flop (4) chooses to retain a currently output data signal or output a data signal received from the master-slave switch (3). The clock buffers (103, 104) input the second control clocks (N1, N2), and generate and output the first control clocks (N3, N4).

According to another aspect of the present invention, load capacitance as viewed from the clock buffers (103, 104), which generates the first control clocks for controlling the input buffer (1), is not coupled to the master flip-flop (2), master-slave switch (3), or slave flip-flop (4). Therefore, the load capacitance can be smaller than in the past. Consequently, an increase in the sizes of the clock buffers can be inhibited even when the gate width of a transistor forming the input buffer (1) is increased to shorten the delay time in the input buffer (1). Further, the output load on the clock buffers is limited to the input buffer. Therefore, the timing of only the input buffer can be changed without affecting the other timings by adjusting the clock buffers (103, 104), which serve as delay elements for setup time adjustment. This makes it easy to adjust the setup time and propagation delay time.

According to the aspects of the present invention, it is made easy to adjust the timing of the D-FF circuit.

In addition, it is possible to adjust the timing of the D-FF circuit while suppressing an increase in circuit area.

BRIEF DESCRIPTION OF THE DRAWINGS

Preferred Embodiments of the present invention will be described in detail based on the following figures, in which.

DETAILED DESCRIPTION

Figure 1:
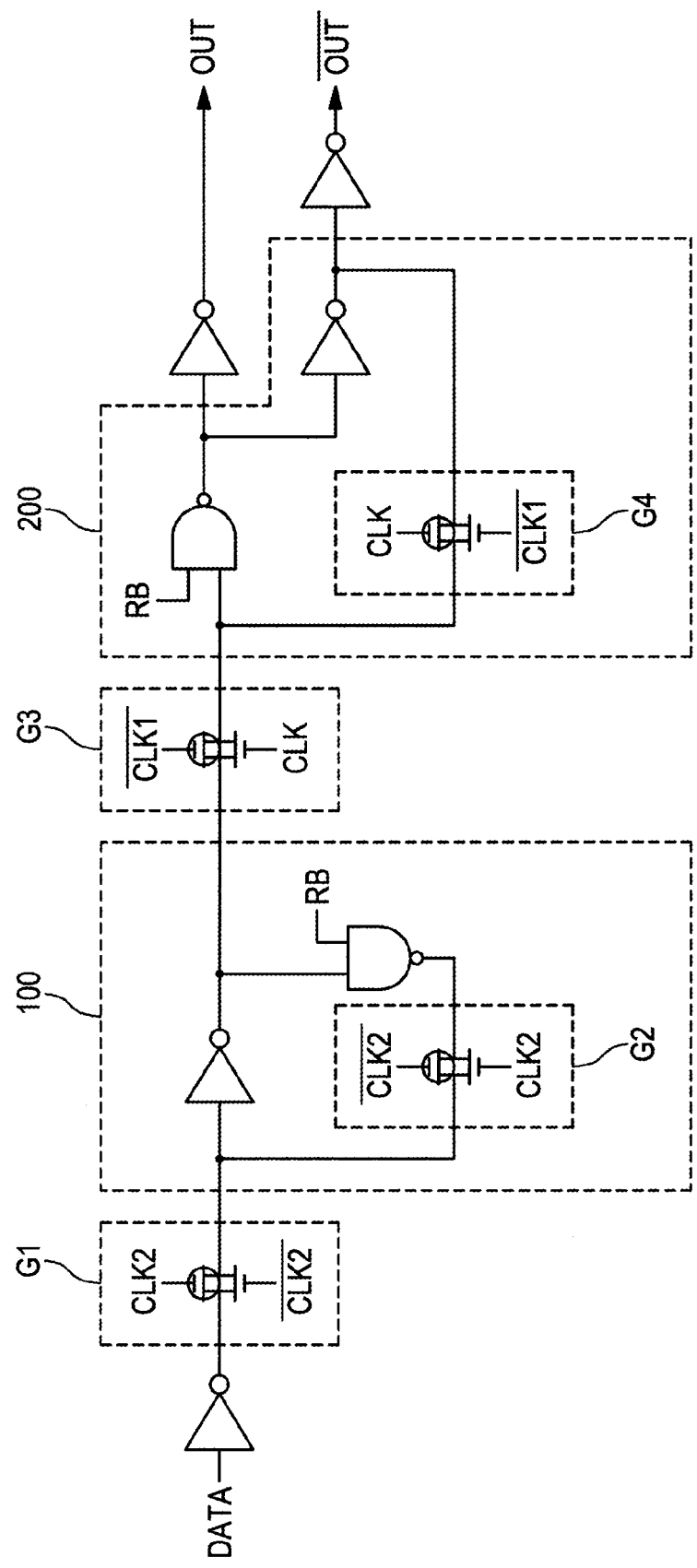
FIG. 1 is a diagram illustrating an example configuration of a D-FF circuit according to a related art.
Figure 2:
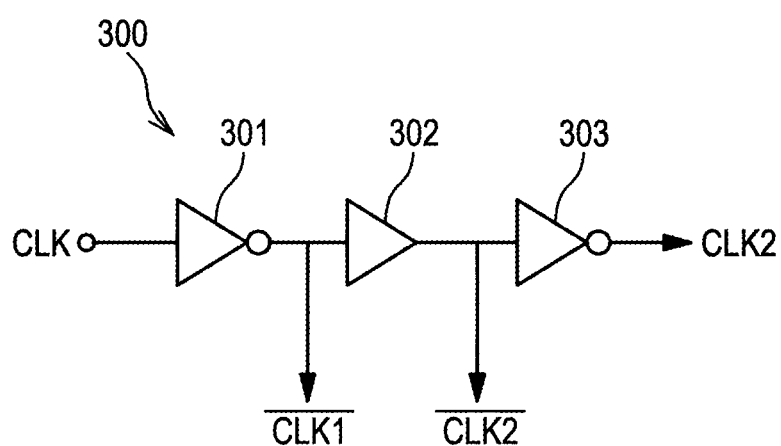
FIG. 2 is a diagram illustrating an example configuration of a clock generator circuit according to a related art.

Preferred Embodiments of the present invention will now be described with reference to the accompanying drawings. In the drawings, identical, similar, or equivalent elements are designated by identical or similar reference numerals.

(Configuration of D-FF Circuit)

Figure 3:
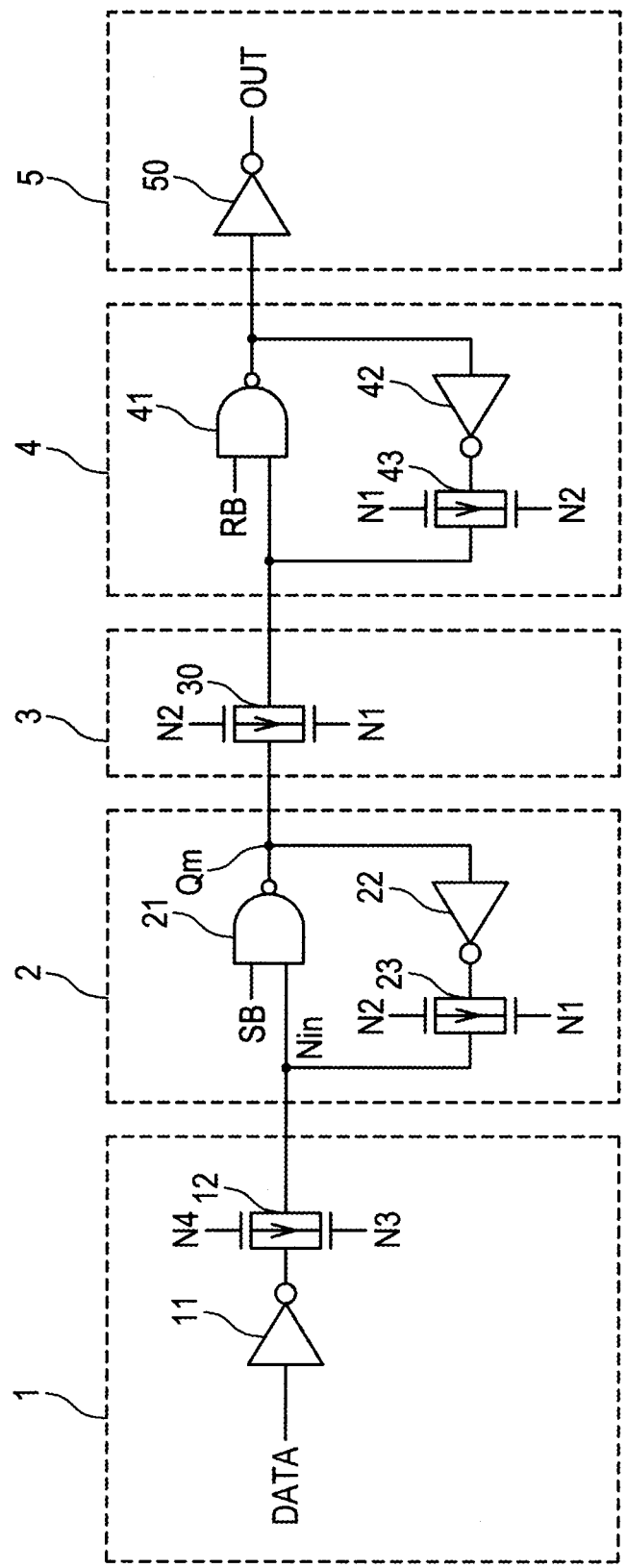
FIG. 3 is a diagram illustrating an example configuration of a D-FF circuit according to an embodiment of the present invention.
Figure 4:
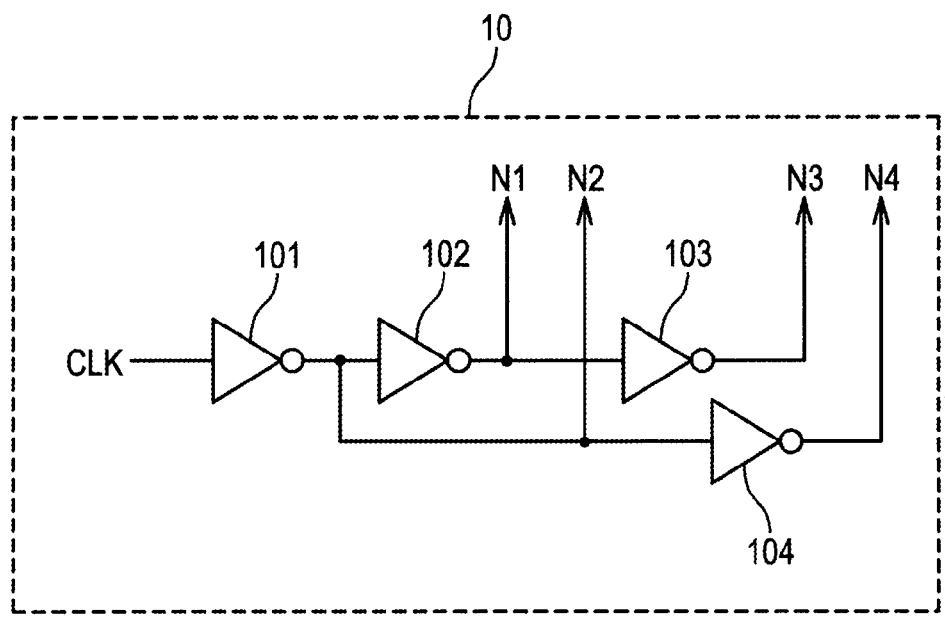
FIG. 4 is a diagram illustrating an example configuration of a clock generator circuit according to an embodiment of the present invention.

A semiconductor integrated circuit according to an embodiment of the present invention includes a master-slave D-FF circuit, which is shown in FIG. 3, and a switch control circuit 10, which is shown in FIG. 4. FIG. 3 is a diagram illustrating an example configuration of the D-FF circuit. Referring to FIG. 3, the D-FF circuit includes an input buffer 1, a master FF 2, a master-slave switch 3 (hereinafter referred to as the M-S switch 3), a slave FF 4, and an output buffer 5.

Data DATA input into the D-FF circuit is input into the master FF 2 through the input buffer 1. Data Qm output from the master FF 2 is input into the slave FF 4 through the M-S switch 3. Output data generated by the slave FF 4 is output as data OUT through the output buffer 5.

The input buffer 1 shown in FIG. 3 includes an inverter 11 and a CMOS transfer gate 12. The inverter 11 inverts the signal level (logic value) of input data and outputs the inverted logic value to the CMOS transfer gate 12. In accordance with control clocks N3, N4, which are complementary to each other, the CMOS transfer gate 12 controls a signal transmission between the output of the inverter 11 and the master FF 2 (input terminal Nin). More specifically, the CMOS transfer gate 12 includes an N-channel MOS transistor and a P-channel MOS transistor. The sources and drains of these transistors are coupled to each other to form input and output terminals. The N-channel MOS transistor inputs the control clock N3 at its gate, whereas the P-channel MOS transistor inputs the control clock N4 at its gate. When the control clock N3 is at a high level (hereinafter referred to as the "H" level) and the control clock N4 is at a low level (hereinafter referred to as the "L" level), the CMOS transfer gate 12 turns on and outputs output data received from the inverter 11 to the input terminal Nin of the master FF 2. Further, when the control clock N3 is at the "L" level and the control clock N4 is at the "H" level, the CMOS transfer gate 12 turns off and blocks the signal transmission between the output of the inverter 11 and the input terminal Nin. While the signal transmission is blocked by the CMOS transfer gate 12, it can be said that a high-impedance (hereinafter referred to as "Hi-Z") output is generated from the CMOS transfer gate 12.

The master FF 2 shown in FIG. 3 includes a NAND circuit 21, an inverter 22, and a CMOS transfer gate 23. The NAND circuit 21 outputs the NAND of an output signal from the input buffer 1 and the signal level (logic value) of a set signal SB to the M-S switch 3 as internal data Qm. The internal data Qm output from the NAND circuit 21 is fed back to the input terminal Nin through the inverter 22 and CMOS transfer gate 23. Setting the set signal at the "L" level sets the internal data Qm of the master FF 2 at the "H" level asynchronously.

The CMOS transfer gate 23 controls the signal transmission between the output of the inverter 22 and the input terminal Nin of the master FF 2 in accordance with control clocks N1, N2, which are complementary to each other. More specifically, the CMOS transfer gate 23 has the same circuit configuration as the CMOS transfer gate 12. The control clock N1 is input into the gate of the N-channel MOS transistor, whereas the control clock N2 is input into the gate of the P-channel MOS transistor. When the control clock N1 is at the "H" level and the control clock N2 is at the "L" level, the CMOS transfer gate 23 turns on. The internal data Qm is then inverted by the inverter 22 and output (fed back) to the input terminal Nin of the master FF 2. Further, when the control clock N1 is at the "L" level and the control clock N2 is at the "H" level, the CMOS transfer gate 23 turns off, blocks the signal transmission from the output of the inverter 22 to the input terminal Nin, and generates a "Hi-Z" output.

The control clock N2 and control clock N4 are substantially complementary to each other, and the control clock N1 and control clock N3 are also substantially complementary to each other. Therefore, when the CMOS transfer gate 12 is on, the CMOS transfer gate 23 is off so that input data DATA is loaded into the master FF 2. When, on the other hand, the CMOS transfer gate 12 is off, the CMOS transfer gate 23 is on so that loaded data Qm is retained (stored) in the master FF 2.

The M-S switch 3 shown in FIG. 3 includes a CMOS transfer gate 30, which controls the input of the internal data Qm from the master FF 2 to the slave FF 4. More specifically, the CMOS transfer gate 30 has the same circuit configuration and the same clock signal coupling to the gate as the CMOS transfer gate 23. When the control clock N1 is at the "H" level and the control clock N2 is at the "L" level, the CMOS transfer gate 30 turns on and outputs the internal data Qm output from the master FF 2 to the input terminal of the slave FF 4. Further, when the control clock Ni is at the "L" level and the control clock N2 is at the "H" level, the CMOS transfer gate 30 turns off, blocks the signal transmission from the output of the master FF 2 to the input of the slave FF 4, and generates a "Hi-Z" output.

The slave FF 4 shown in FIG. 3 includes a NAND circuit 41, an inverter 42, and a CMOS transfer gate 43. The NAND circuit 41 outputs the NAND of an output generated from the master FF 2 through the M-S switch 3 and the signal level (logic value) of a reset signal RB (the term "RB" is an acronym for "reset bar") to the output buffer 5. A signal output from the NAND circuit 41 is fed back to the input of the NAND circuit 41 through the inverter 42 and CMOS transfer gate 43. Setting the reset signal RB at the "L" level sets output data OUT at the "L" level asynchronously.

The CMOS transfer gate 43 controls the signal transmission between the output of the inverter 42 and the input terminal of the slave FF 4 (the input of the NAND circuit 41) in accordance with the control clocks N2, N1, which are complementary to each other. More specifically, when the control clock N2 is at the "H" level and the control clock N1 is at the "L" level, the CMOS transfer gate 43 turns on to output (feed back) the inverted output of the NAND circuit 41 to the input of the slave FF 4. Further, when the control clock N2 is at the "L" level and the control clock N1 is at the "H" level, the CMOS transfer gate 43 turns off to block the signal transmission from the output of the inverter 42 to the input of the NAND circuit 41.

When the CMOS transfer gate 30 is on, the CMOS transfer gate 43 is off so that the internal data Qm input from the master FF 2 is loaded into the slave FF 4. When the CMOS transfer gate 30 is off, the CMOS transfer gate 43 is on so that the loaded internal data Qm is retained (stored) in the slave FF 4.

As described above, in the D-FF circuit according to an embodiment of the present invention, the opening and closing of an input control switch (the CMOS transfer gate 12 shown in FIG. 3) that controls the loading of data DATA into the master FF 2 is controlled by the control clocks N3, N4, which differ from the control clocks N1, N2 that control the opening and closing of the other switches. Consequently, the opening/closing timing of the input control switch (CMOS transfer gate 12) for the master FF 2 can be adjusted independently of the other switches. The other switches are a feedback control switch (the CMOS transfer gate 23 shown in FIG. 3) for controlling the selection of a storage mode in which the internal data Qm is retained in the master FF 2, an input control switch (the CMOS transfer gate 30 shown in FIG. 3) for controlling the loading of the internal data Qm into the slave FF 4, and a feedback control switch (the CMOS transfer gate 43 shown in FIG. 3) for controlling the selection of a storage mode in which the output value of the slave FF 4 is retained in the slave FF 4.

The switching timing of each switch in the D-FF circuit according to an embodiment of the present invention is controlled by the switch control circuit 10 shown, for instance, in FIG. 4. FIG. 4 is a diagram illustrating an example configuration of the switch control circuit according to an embodiment of the present invention. Referring to FIG. 4, the switch control circuit 10 includes inverters 101, 102, 103, 104 and generates the control clocks N1, N2, N3, and N4 in accordance with an input clock CLK.

More specifically, the inverter 101 inverts the signal level of the input clock CLK, and outputs the inverted clock to the inverters 102, 104 and D-FF circuit as the control clock N2. The inverter 102 inverts the signal level of the input control clock N2, and outputs the inverted clock to the inverter 103 and D-FF circuit as the control clock Ni. The inverter 103 inverts the signal level of the input control clock N1, and outputs the inverted clock to the D-FF circuit as the control clock N3. The inverter 104 inverts the signal level of the input control clock N2, and outputs the inverted clock to the D-FF circuit as the control clock N4.

In the switch control circuit 10 according to an embodiment of the present invention, a pair of control clocks N1, N2, which are complementary to each other, are input into the inverters 103, 104 to generate another pair of control clocks N3, N4, which are also complementary to each other. Therefore, the timings of the control clocks N3, N4 can be adjusted by adjusting only the driving capacities of the inverters 103, 104.

Further, the outputs of the inverters 103, 104 are coupled to the CMOS transfer gate 12, but are not coupled to the other control switches (CMOS transfer gates 23, 30, 43). It means that the outputs of the inverters 103, 104 are not affected by the load capacitances provided by the other control switches. Therefore, when the driving forces of the inverters 103, 104 are to be adjusted, only the load capacitance provided by the CMOS transfer gate 12 needs to be taken into consideration. Conversely, changes in the driving capacities of the inverters 103, 104 would not affect the timings of the other control clocks N1, N2. In other words, the driving capacities of the inverters 103, 104 can be adjusted independently.

The inventors have found that when only the timing at which the data DATA is loaded into the input buffer 1 is adjusted, the timing of the D-FF circuit can be adjusted in accordance with the speed of the data DATA even if the timings of the other switches (the timing of data retention in the master FF 2 and the timings of loading and retaining the internal data Qm) are not adjusted. In an embodiment of the present invention, therefore, the opening and closing of the input control switch (CMOS transfer gate 12) for controlling the loading of data DATA into the master FF 2 can be adjusted independently of the other switches (CMOS transfer gates 23, 30, 43). Further, when the opening/closing timing of the input control switch (CMOS transfer gate 12) is to be adjusted, only the inverters 103, 104 need to be adjusted without considering the load capacitances provided by the other switches. Consequently, the present invention ensures that the timing adjustments of the D-FF circuit can be made more efficiently (more easily) than ever.

(Operations)

A setup time improvement mechanism of the D-FF circuit according to an embodiment of the present invention will now be described with reference to FIGS. 5A and 5B. As an example, the D-FF circuit operating at the rising edge is described below. For the sake of brevity of explanation, it is assumed in the following description that the phase difference between the control clock N1 and the control clock N2, which are complementary to each other, is negligible, and that the phase difference between the control clock N3 and the control clock N4, which are also complementary to each other, is also negligible.

Figure 5:
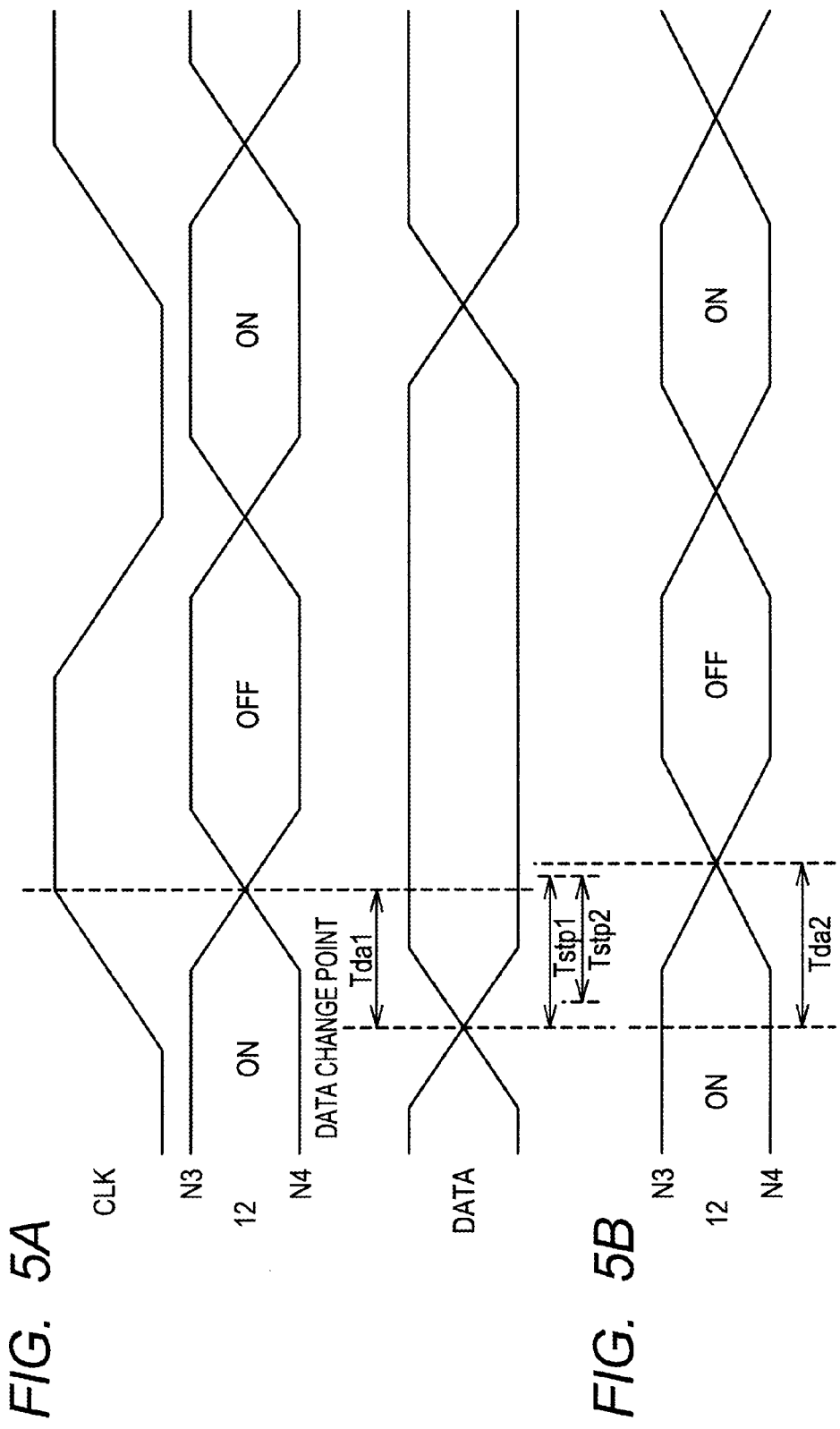
FIGS. 5A and 5B are timing diagrams illustrating exemplary data transfer operations for the purpose of depicting a setup time improvement mechanism of the D-FF circuit according to an embodiment of the present invention.

FIG. 5A is a timing diagram illustrating an exemplary data transfer operation that is performed before the timing adjustments of the D-FF circuit according to an embodiment of the present invention. Referring to FIG. 5A, it is assumed that the setup time Tstp required for the loading of data DATA is "Tstp1," and that the time interval between the time of conversion of the data DATA and the active edges of the control clocks N3, N4 at which the CMOS transfer gate 12 starts operating is "Tda1." When "Tstpl" is longer than "Tda1," the data DATA may not be loaded into the D-FF circuit because the setup time required for the loading of the data DATA is not secured.

However, when the setup time Tstp required for the loading of the data DATA is shortened to "Tstp2," which is shorter than "Tda1," the data DATA can be successfully loaded to permit the D-FF circuit handle high-speed data.

To shorten the setup time Tstp, which is required for the loading of the data DATA, to "Tstp2," it is necessary to increase the gate width W of a transistor included in the CMOS transfer gate 12. However, if the above-mentioned transistor gate width is increased, the output load capacitance of the switch control circuit 10, which drives the CMOS transfer gate 12, is increased to dull the control clocks N3, N4. To avoid such a situation, the present invention increases the driving capacity of the clock buffers (inverters 103, 104) by increasing the gate width W of transistors included in the inverters 103, 104. This decreases the load capacitance as viewed from the clock buffers (inverters 103, 104). In this instance, the control clocks N3, N4 are not output to the other control switches (CMOS transfer gates 23, 30, 43). Therefore, the timing adjustments can be made without considering the operations performed relative to the other control switches.

In an embodiment of the present invention, the setup time required for the loading of the data DATA can be adjusted without changing the driving capacities of the clock buffers (inverters 101, 102), which output the control clocks N1, N2. In other words, the timing adjustments can be made so as to handle high-speed data without increasing the sizes of the clock buffers (inverters 101, 102), which output the control clocks N1, N2.

Further, when timing adjustments are to be made in order to transfer high-speed data, the setup time can be secured by dulling the waveforms of the control clocks N3, N4. FIG. 5B is a timing diagram illustrating the waveforms of the control clocks N3, N4 that are obtained after timing adjustments. Referring to FIG. 5B, the time interval between the time of conversion of the data DATA and the active edges of the control clocks N3, N4 at which the CMOS transfer gate 12 starts operating is changed to "Tda2," which is longer than the required setup time Tstpl, by dulling the waveforms of the control clocks N3, N4. This ensures that the required setup time is secured even when high-speed data is handled.

When the control clocks N3, N4 are to be retarded as shown in FIG. 5B, the gate widths of transistors included in the clock buffers (inverters 103, 104) should be decreased. In this instance, the control clocks N3, N4 are not output to the other control switches (CMOS transfer gates 23, 30, 43). Therefore, the timing adjustments can be made without considering the operations performed relative to the other control switches.

Further, when the control clocks N3, N4 are to be retarded, as is the case with the above paragraph, the setup time required for the loading of the data DATA can be adjusted without changing the driving capacities of the clock buffers (inverters 101, 102), which output the control clocks N1, N2. In other words, the timing adjustments can be made so as to handle high-speed data without changing the sizes of the clock buffers (inverters 101, 102), which output the control clocks N1, N2.

The propagation delay time tpd of the D-FF circuit according to an embodiment of the present invention is determined by the control clocks N1, N2 and is not dependent on the control clocks N3, N4, which determine the loading timing of the data DATA. Hence, the propagation delay time tpd of the D-FF circuit remains unaffected even when the control clocks N3, N4 are adjusted in order to adjust the setup time. In other words, the present invention makes it possible to improve the setup time without having to consider the influence upon the propagation delay time tpd of the D-FF circuit.

In an embodiment of the present invention, the outputs of the clock buffers (inverters 103, 104) are not coupled to the master FF 2, M-S switch 3, or slave FF 4, but are coupled only to the input control switch (the CMOS transfer gate 12 in the present example) of the input buffer 1. According to an embodiment of the present invention, therefore, the waveforms of the control clocks N3, N4 can be adjusted without considering the load capacitances provided by control switches (CMOS transfer gates 23, 30, 43) other than the input control switch (CMOS transfer gate 12) of the input buffer 1. Conversely, even if the waveforms of the control clocks N3, N4 are adjusted, the timings of the other control clocks N1, N2 remain unaffected. It means that the control clocks N3, N4 can be adjusted independently. Hence, the waveforms of the control clocks N3, N4 can be adjusted in accordance with an increase in the speed of the clock CLK without unduly changing the sizes of the clock buffers (inverters 103, 104). Consequently, the timing adjustments can be made to cope with speed enhancement more efficiently (more easily) than ever.

As described above, in the master-slave D-FF according to an embodiment of the present invention, the clock buffers used to generate the control clocks N3, N4, which control the loading of the data signal DATA into the master FF 2, are different from the clock buffers used to generate the control clocks N1, N2, which control the retention of data in the master FF 2 and the loading of data into and the retention of data in the slave FF 4. Therefore, the timings of the control clocks N3, N4, which control a data input control switch for the master FF 2, can be adjusted without considering the load capacitances provided by the other control switches. This not only facilitates the timing adjustments of the master-slave D-FF but also prevents an undue increase in the sizes of the clock buffers.

Although only specific embodiments of the present invention have been described in detail, the present invention is not limited thereto but is meant to include all embodiments modified within the spirit of the present invention. For example, the switch control circuit 10 shown in FIG. 4 uses inverters as the clock buffers that generate the control clocks N3, N4. However, as shown in FIG. 6, non-inverting buffers 203, 204 may be used in place of the above-mentioned inverters.

Figure 6:
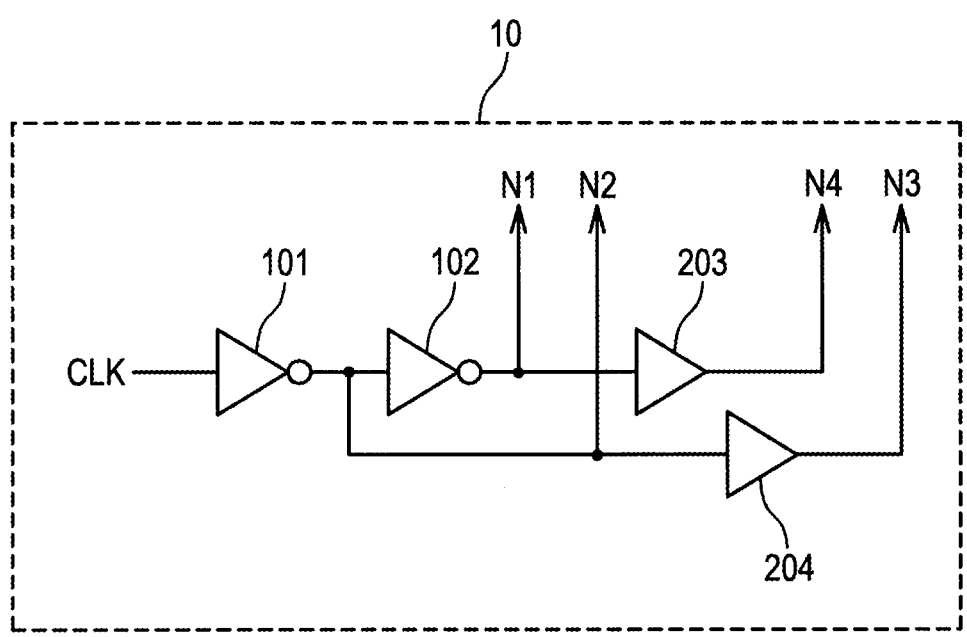
FIG. 6 is a diagram illustrating an example configuration of a switch control circuit according to an embodiment of the present invention.

FIG. 6 is a diagram illustrating another example configuration of the switch control circuit 10 according to an embodiment of the present invention. Referring to FIG. 6, the switch control circuit 10 includes inverters 101, 102 and non-inverting buffers 203, 204, and generates control clocks N1, N2, N3, and N4 in accordance with an input clock CLK.

More specifically, the inverter 101 inverts the signal level of the input clock CLK, and outputs the inverted clock to the inverter 102, non-inverting buffer 204, and D-FF circuit as the control clock N2. The inverter 102 inverts the signal level of the input control clock N2, and outputs the inverted clock to the non-inverting buffer 203 and D-FF circuit as the control clock N1. The non-inverting buffer 203 buffers the input control clock N1 to obtain the control clock N4, and then outputs the control clock N4 to the D-FF circuit. The non-inverting buffer 204 buffers the input control clock N2 to obtain the control clock N3, and then outputs the control clock N3 to the D-FF circuit.

In the example shown in FIG. 6, outputs N3 and N4 are interchanged because the buffers 203, 204 are used in place of the inverters 103, 104. Operations concerning the other timing adjustments are the same as described above. The non-inverting buffers 203, 204 include an even number of (usually two) cascade-coupled inverters. Therefore, the amount of delay of the control clocks N3, N4 relative to the control clocks N1, N2 is increased so that operations can be performed even when the setup time is shorter than in the example described earlier. Further, as the rise time and fall time (tr, tf) of the control clocks N3, N4 can be decreased, higher-speed operations can be handled. Furthermore, the load capacitance as viewed from the inverters 101, 102 is limited to the first-stage inverters of the buffers 203, 204. Therefore, even if the dimensions of transistors forming the output stages of the buffers 203, 204 are changed in order to provide a different driving capacity, the load capacitances of the inverters 101, 102 remain unchanged. This eliminates the influence on the control clocks N1, N2 and provides an advantage in that the setup time can be adjusted with ease.

Although the CMOS transfer gate 12, which is based on a CMOS transistor, is described as an input control switch of the data DATA for the master FF 2 with reference to FIG. 3, the present invention is not limited to such a configuration. A switch circuit having a different configuration may alternatively be used. Moreover, a clocked inverter 13 whose operation is controlled by the control clocks N3, N4 may be used in place of the inverter 11 and CMOS transfer gate 12 shown in FIG. 3.

Figure 7:
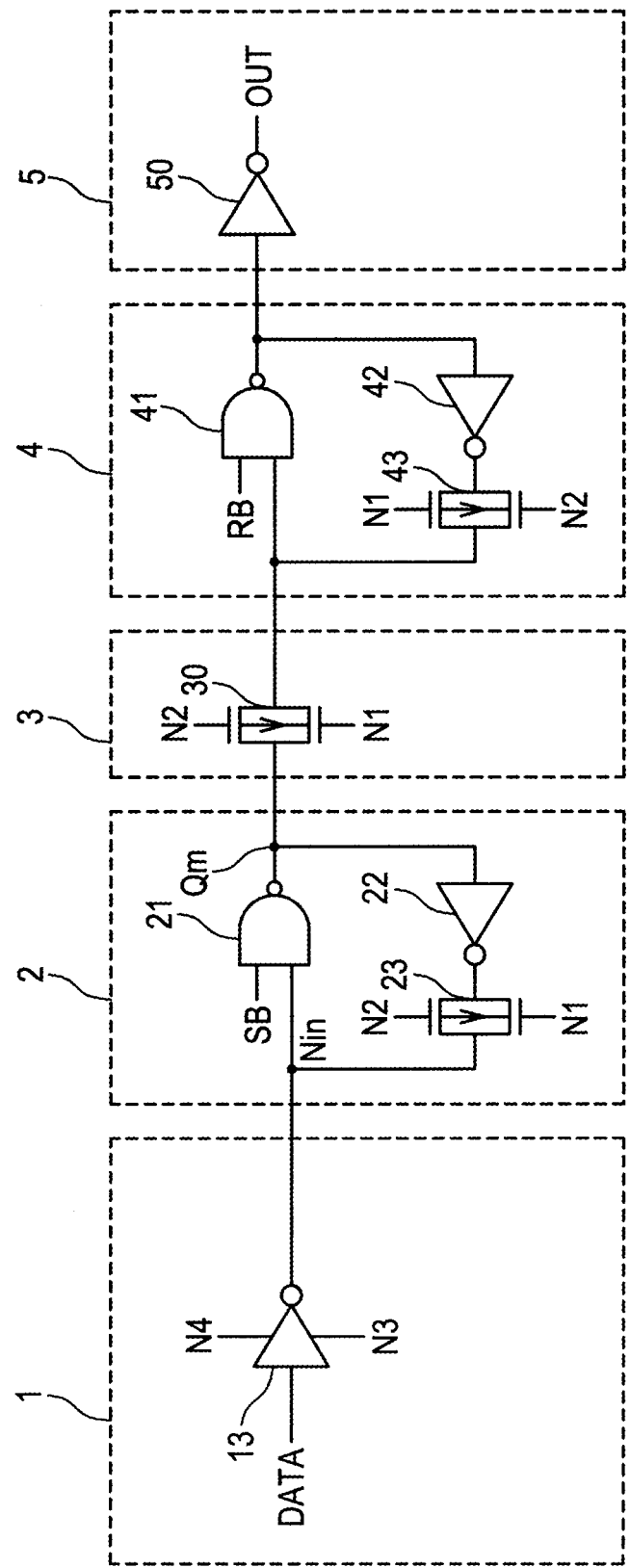
FIG. 7 is a diagram illustrating another example configuration of the D-FF circuit according to an embodiment of the present invention.

FIG. 7 is a diagram illustrating another example configuration of the D-FF circuit according to an embodiment of the present invention. The D-FF circuit shown in FIG. 7 includes an input buffer 1, which includes a clocked inverter 13. The other elements are the same as for the D-FF circuit shown in FIG. 3.

The clocked inverter 13 inverts the signal level (logic value) of input data and outputs the inverted data to the input terminal Nin of the master FF 2. More specifically, the clocked inverter 13 turns on when the control clock N3 is at the "H" level and the control clock N4 is at the "L" level, and outputs the inverted data of the data DATA to the input terminal Nin of the master FF 2. Further, the clocked inverter 13 turns off when the control clock N3 is at the "L" level and the control clock N4 is at the "H" level, and places the input terminal Nin of the master FF 2 in a high-impedance state.

The operations of the D-FF circuit shown in FIG. 7 are the same as described earlier. Further, .the D-FF circuit shown in FIG. 7 facilitates the timing adjustments as described earlier. However, the layout area of the clocked inverter is at an advantage in that it is smaller than the layout area of a transfer gate. More specifically, the input buffer 1 shown in FIG. 3 needs to be configured in such a manner that the transistors for the inverter 11 and CMOS transfer gate 12 are separately formed. On the other hand, the clocked inverter 13 can be configured so that a diffusion layer is shared by a switch transistor, which provides switching control in accordance with the control clocks N3, N4, and an inverter transistor, which inverts a signal. Therefore, using the clocked inverter 13 as the input buffer 1 makes it possible to reduce the area of the input buffer 1.

The above-described D-FF circuit and switch control circuit 10 can be combined as far as no technical discrepancy arises. Further, although the D-FF circuit operating at the rising edge is described as an example with reference to FIGS. 5A and 5B, the present invention is also applicable to the D-FF circuit operating at the falling edge. Furthermore, in the example described earlier, the master FF 2, the M-S switch 3, and the slave FF 4 operate in synchronism with the same control clocks N1, N2. However, the present invention is not limited to such a situation. The present invention is also applicable to a situation where the master FF 2, the M-S switch 3, and the slave FF 4 operate in synchronism with different control clocks as far as they differ from the control clocks N3, N4.

In an embodiment of the present invention, the load capacitance as viewed from the clock buffers in the switch control circuit 10 is lower than before because it results from the input buffer 1 only. Therefore, even when the gate width of a transistor forming the input control switch (CMOS transfer gate 12 or clocked inverter 13) is increased to shorten the delay time in the input buffer 1, it is possible to suppress an increase in the sizes of the clock buffers. Further, the clock buffers (inverters 103, 104 or non-inverting buffers 203, 204) that double as delay elements are merely expected to drive the gate of an N-channel MOS transistor or P-channel MOS transistor forming the input control switch (CMOS transfer gate 12 or clocked inverter 13). Therefore, even when the transistor size is reduced for timing adjustment purposes, the influence on the overall layout size is small. In addition, the influence on the other components (not shown) coupled to the clock buffers is limited. Consequently, the setup time can be adjusted with ease.

What is claimed is:

1. A semiconductor integrated circuit comprising:
a D-FF circuit; and
a switch control circuit,
wherein the D-FF circuit includes
    an input buffer that chooses, in accordance with a first control clock, to output an input data signal or output a high-impedance signal,
    a master flip-flop that chooses, in accordance with a second control clock to output a data signal received from the input buffer or retain a currently output data signal,
    a master-slave switch that chooses, in accordance with a second control clock, to output a high-impedance signal or output a data signal received from the master flip-flop, and
    a slave flip-flop that chooses, in accordance with a second control clock, to retain a currently output data signal or output a data signal received from the master-slave switch,
wherein the input buffer does not receive the second control clock,
wherein none of the master flip-flop, the master-slave switch, and the slave flip-flop receive the first control clock,
and wherein the switch control circuit includes:
    a first clock buffer that receives an external clock and outputs the second control clock, and
    a second clock buffer that receives the second control clock, retards rising and/or falling edges of the second control clock, and outputs the first control clock.

2. The semiconductor integrated circuit according to claim 1, wherein the input buffer includes a clocked inverter, which operates in accordance with the first control clock, inverts the data signal, and outputs the inverted data signal to the master flip-flop.

3. The semiconductor integrated circuit according to claim 1, wherein at least one of the first and second clock buffers is an inverter.

4. The semiconductor integrated circuit according to claim 1, wherein at least one of the first and second clock buffers is a non-inverting buffer.

5. The semiconductor integrated circuit according to claim 1,
wherein the first control clock comprises a first pair of complementary clocks,
wherein the second control clock comprises a second pair of complementary clocks.

* * * * *